United States Patent
Yang et al.

(10) Patent No.: US 12,295,115 B2
(45) Date of Patent: May 6, 2025

(54) STABILIZING FIXTURE FOR SERVER CABINET

(71) Applicant: Fulian Precision Electronics (Tianjin) Co., LTD., Tianjin (CN)

(72) Inventors: Bin-Bin Yang, Tianjin (CN); Han-Yu Li, New Taipei (TW); Ya-Ni Zhang, Tianjin (CN); Meng-Ya Cui, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 325 days.

(21) Appl. No.: 18/072,504

(22) Filed: Nov. 30, 2022

(65) Prior Publication Data

US 2023/0217623 A1    Jul. 6, 2023

(30) Foreign Application Priority Data

Dec. 31, 2021 (CN) .......................... 202111667559.6

(51) Int. Cl.
H05K 7/14         (2006.01)
(52) U.S. Cl.
CPC .................. H05K 7/1489 (2013.01)
(58) Field of Classification Search
None
See application file for complete search history.

(56) References Cited

U.S. PATENT DOCUMENTS

| 10,034,403 | B1* | 7/2018 | Flannery | F16B 2/14 |
| 2003/0048049 | A1* | 3/2003 | Seal | F16B 2/14 |
| | | | | 312/294 |
| 2008/0019102 | A1* | 1/2008 | Yurko | H05K 7/20545 |
| | | | | 361/719 |
| 2010/0020514 | A1* | 1/2010 | Lee | H05K 7/1404 |
| | | | | 361/801 |
| 2016/0100505 | A1* | 4/2016 | Reid | H05K 7/20545 |
| | | | | 29/832 |

FOREIGN PATENT DOCUMENTS

| TW | I504335 B | 10/2015 |
| TW | M528830 U | 9/2016 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

A stabilizing fixture to hold and stabilize a server contained within different sizes of server cabinets includes a base, a pressing component and an adjusting component. The pressing component is slidably coupled with the base in a first direction. A first pressing surface is defined on the pressing component for pressing a server. The adjusting component includes a screw and a nut. When the screw is rotated relative to the nut, the nut is driven to move in a second direction, and the nut acts on the pressing component to drive the pressing component in the first direction to press the server. As the pressing component moves along the first direction, the distance between the two pressing component changes to accommodate servers of different sizes.

17 Claims, 5 Drawing Sheets

STABILIZING FIXTURE FOR SERVER CABINET

CROSS-REFERENCE TO RELATED APPLICATIONS

This application claims priority to Chinese Patent Application No. 202111667559.6 filed on Dec. 31, 2021, filed in China National Intellectual Property Administration, the contents of which are incorporated by reference herein.

FIELD

The subject matter herein generally relates to server technology, and more particularly to a stabilizing fixture in a server cabinet.

BACKGROUND

Servers are generally placed in cabinets for security and protection. When handling the cabinet, the server in the cabinet may be shaken, thereby increase the risk of damaging the server. Some types of cabinets can stabilize the position of servers to reduce effects caused by shaking and impacts, but adapting the same cabinet to different sizes of servers is difficult. Therefore, there is a need to design a fixture that can adapt to servers of different sizes.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
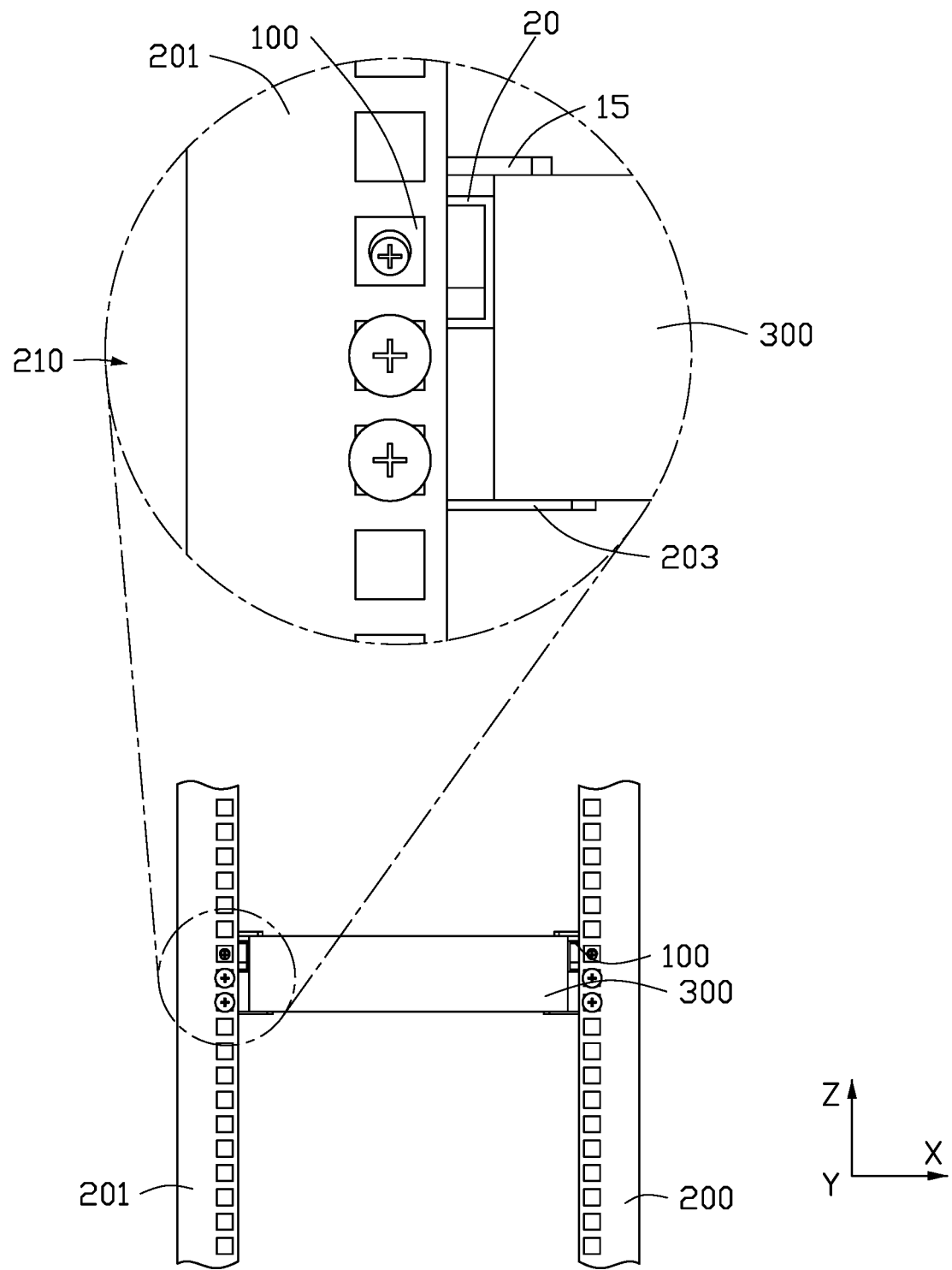
FIG. 1 is an isometric, assembled view of a server cabinet in an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one."

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

As shown in FIG. 1, a cabinet 200 of a first embodiment includes two support columns 210 spaced along the first direction X. A space is formed between the two support columns 210. The cabinet 200 is configured to accommodate a server 300 in a second direction Y. The second direction Y is perpendicular to the first direction X. Each of the two support columns 210 includes a column 201 and a stabilizing fixture 100. The column 201 extends along a third direction Z. The third direction Z is perpendicular to the first direction X and the second direction Y. The two support columns 210 are symmetrical in structure. The server 300 is placed in the cabinet 200, and the stabilizing fixtures 100 are pressed against opposite sides of the server 300, so to stably fix the server 300 in the cabinet 200.

Figure 2:
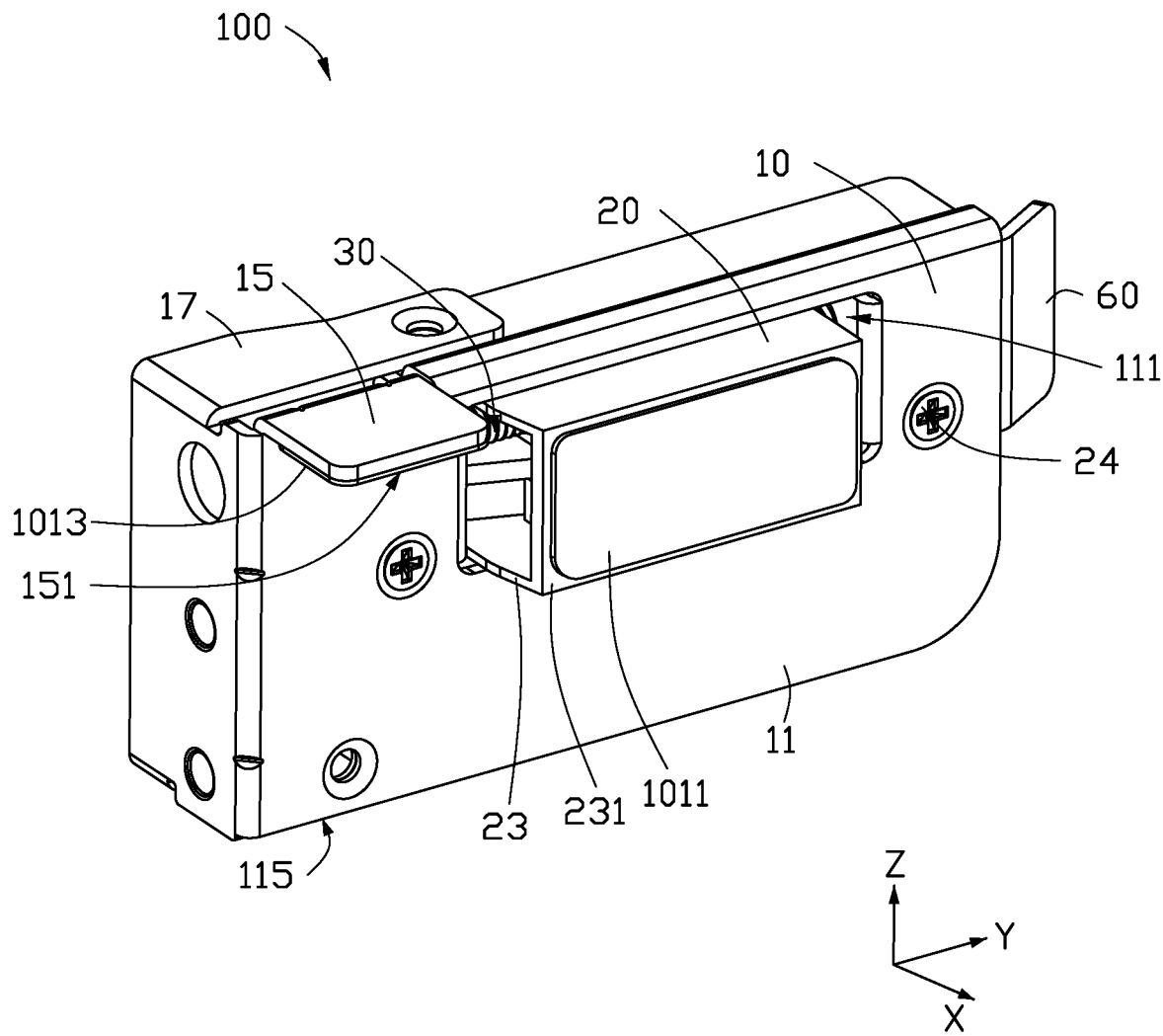
FIG. 2 is an isometric, assembled view of a stabilizing fixture in the server cabinet of FIG. 1.
Figure 3:
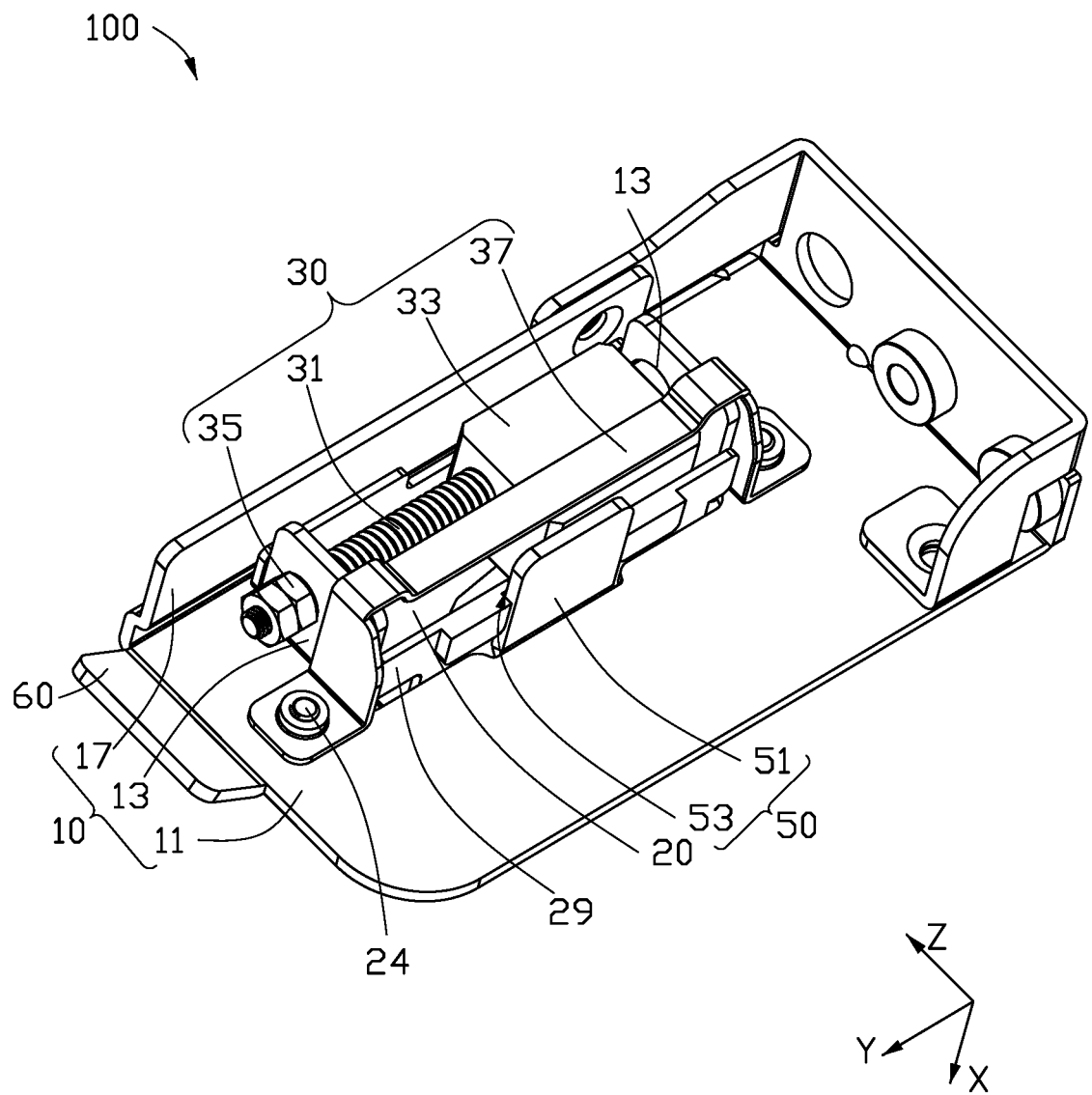
FIG. 3 is another isometric, assembled view of the stabilizing fixture in FIG. 2.
Figure 4:
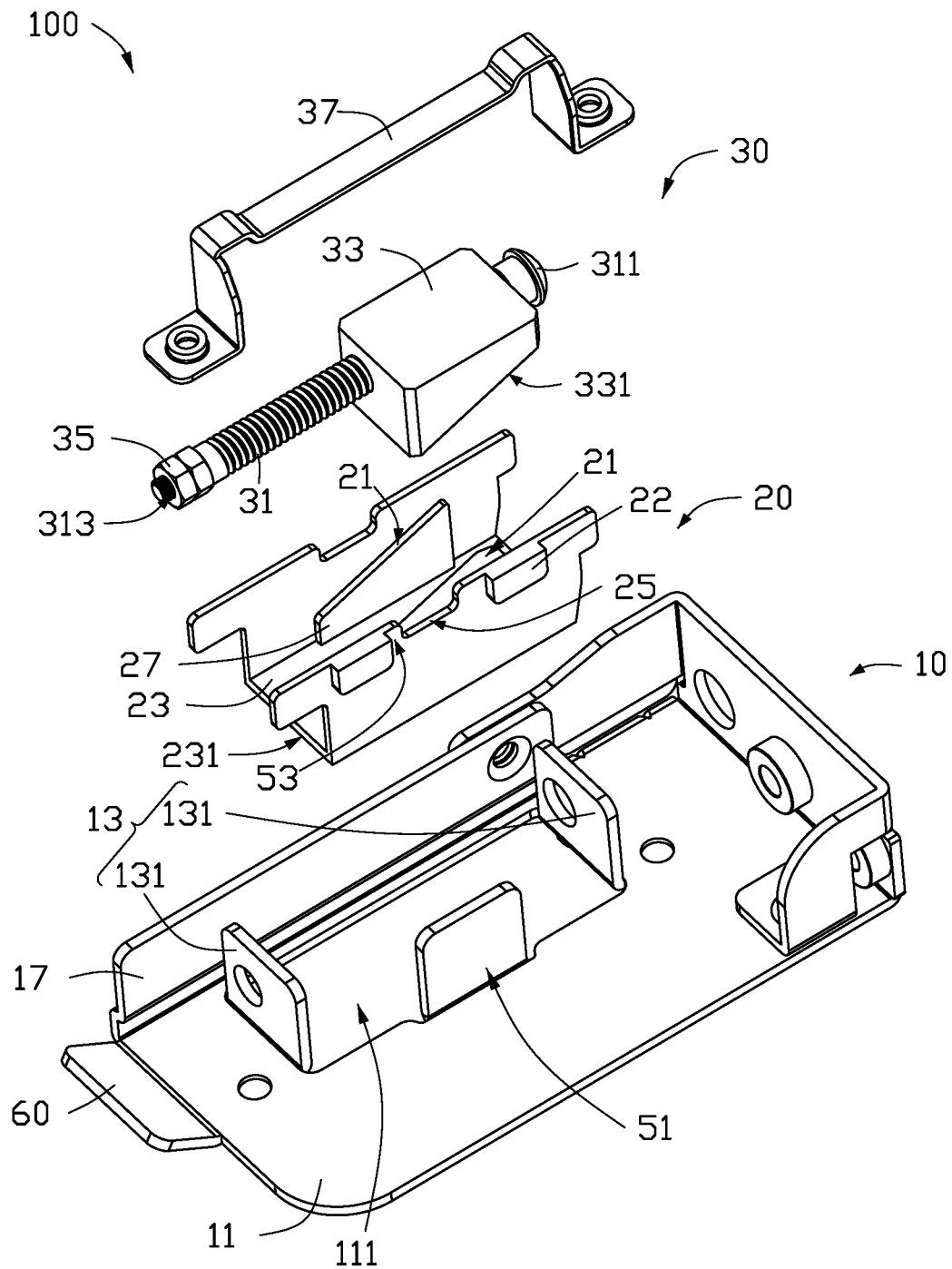
FIG. 4 is an exploded view of a side structure of the stabilizing fixture of FIG. 3.

As shown in FIGS. 2, 3, and 4, the stabilizing fixture 100 includes a base 10, a pressing component 20, and an adjusting component 30. The base 10 is coupled with the column 201, and the pressing component 20 is slidably coupled with the base 10. The sliding direction of the pressing component 20 is parallel to the first direction X. The adjusting component 30 is configured to adjust the position of the pressing component 20 to drive a first pressing surface 231 of the pressing component 20 against the server 300. The adjusting component 30 includes a screw 31 and a nut 33. The screw 31 is rotatably coupled with the base 10. The screw 31 extends along the second direction Y. The nut 33 is threaded to the screw 31 so that the nut 33 can be driven along the second direction Y when the screw 31 is rotated relative to the nut 33. A first bevel 21 is defined on the pressing component 20, and a second bevel 331 is defined on the nut 33. The first bevel 21 is attached to the second bevel 331. When the screw 31 is rotated relative to the nut 33, the nut 33 moves along the second direction Y and presses the pressing component 20 in the first direction X by the action of the first bevel 21 and the second bevel 331. Different sizes of server 300 can be matched by adjusting the distance from the pressing component 20 of one support column 210 to another.

It will be appreciated that the screw 31 may also extend along the third direction Z to drive the pressing component 20 perpendicular to the first direction X.

The base 10 includes a plate 11 and a clamping pair 13. The clamping pair 13 includes two clamping portions 131 spaced along the second direction Y. The plate 11 is provided with a first through hole 111. The two clamping portions 131 are fixedly coupled to the plate 11 and located on opposite sides of the first through hole 111. Each of the two clamping portions 131 extends from the main body in the first direction X.

A mounting hole is defined on the clamping portion 131. The screw 31 passes through the mounting hole, and can be rotated relative to the clamping portion 131. An adjusting part 311 is defined at one end of the screw 31 and a threaded rod 313 is defined at the other end of the screw 31. The screw 31 can be rotated relative to the base 10 by driving the adjusting part 311. The adjusting component 30 further includes a fastener 35. The fastener 35 has threads to match the threaded rod 313. The fastener 35 and the adjusting part 311 are located on opposite sides of the clamping pair 13 along the second direction Y, so that the screw 31 can be rotatably coupled with the base 10 without being detached from the base 10.

The pressing component 20 presses against the server 300 to eliminate any gap on both sides of the server 300 along the second direction Y, thus reducing the shaking of the server 300. The nut 33 is self-locking with the screw 31, and/or the first bevel 21 is self-locking with the second bevel 331, allowing the pressing component 20 to contact the server 300 and hold it stably.

By rotating the screw 31, the nut 33 moves in the second direction Y. When the nut 33 moves in the second direction Y, the first bevel 21 is pressed against the second bevel 331 to drive the pressing component 20 in the first direction X, to adjust the size of the pressing component 20 protruding from the base 10.

Figure 5:
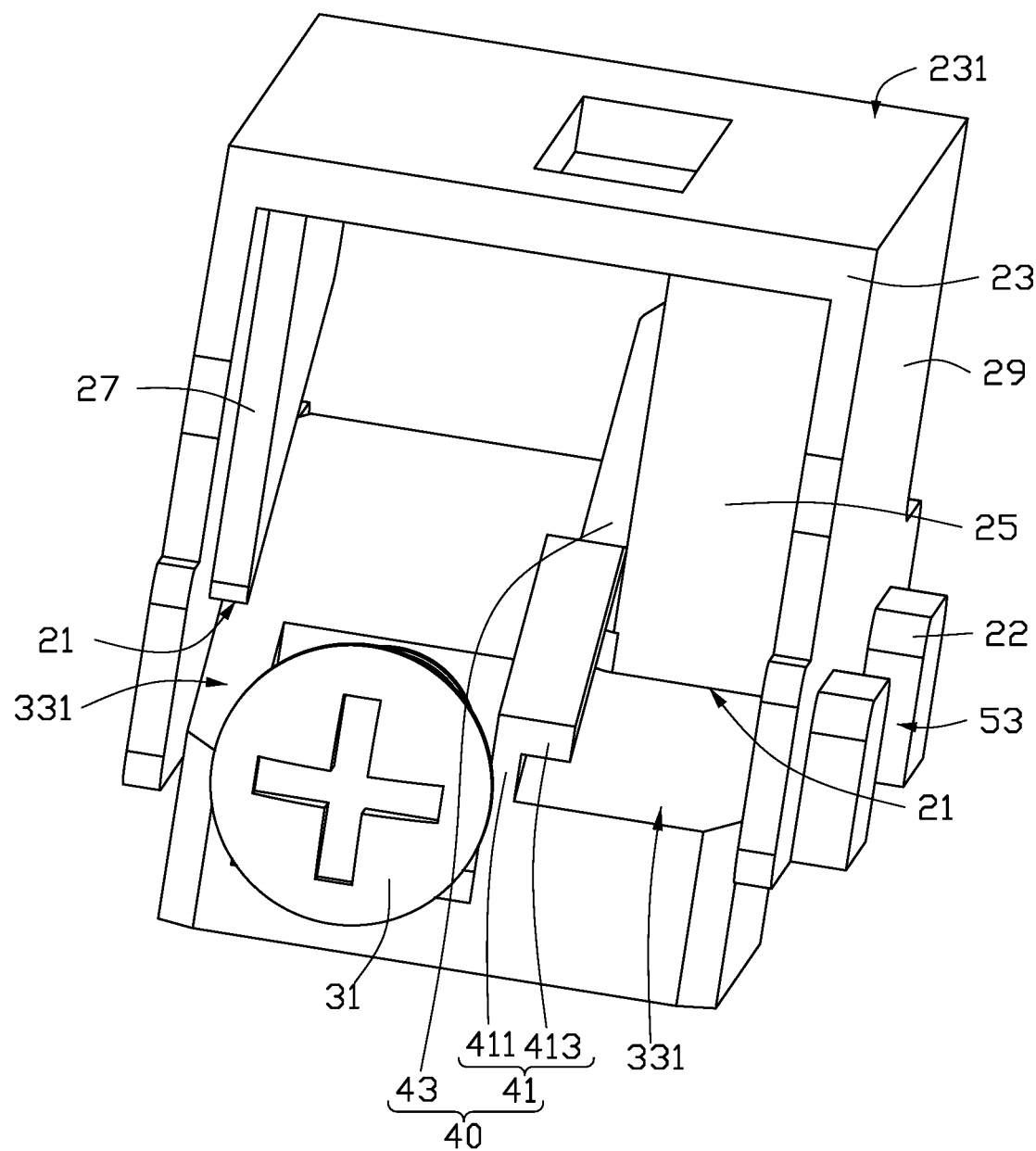
FIG. 5 is an isometric, assembled view of a pressing component and an adjusting component of the stabilizing fixture.

As shown in FIG. 5, the stabilizing fixture 100 further includes a guiding structure 40. The guiding structure 40 includes a first guiding member 41 and a second guiding member 43. The first guiding member 41 is set on the nut 33, and the second guiding member 43 is set on the pressing component 20. The first guiding member 41 contacts the side of the second guiding member 43 away from the nut 33, so that the nut 33 can drive the pressing component 20 not only to move the first pressing surface 231 away from the base 10, but also to bring it closer to the base 10.

The first guiding member 41 includes a first part 411 and a second part 413. The first part 411 extends from the second bevel 331 in the first direction X. The second part 413 extends from the first part 411 in a direction parallel to the second bevel 331. A gap is formed between the second part 413 and the second bevel 331. The second guiding member 43 is set on the pressing component 20, and extends into the gap between the second part 413 and the second bevel 331. The second guiding member 43 contacts the second bevel 331 such that the second guiding member 43 can move along the second bevel 331. The second part 413 and the second bevel 331 grip the second guiding member 43 and prevent disengagement of the pressing component 20 from the nut 33.

As shown in FIG. 4, the pressing component 20 includes a first pressing part 23 and a first guiding part 25. The first guiding part 25 is fixedly coupled to the first pressing part 23. The side of the first guiding part 25 away from the first pressing part 23 forms a portion of the first bevel 21.

The pressing component 20 further includes a second guiding part 27. The second guiding part 27 is fixedly coupled with the first pressing part 23, and is spaced from the first guiding part 25. The side of the second guiding part 27 away from the first pressing part 23 forms the other portion of the first bevel 21. The first guiding part 25 and the second guiding part 27 act together on the nut 33, so that the nut 33 can drive the movement of the pressing component 20 in a steady manner.

As shown in FIGS. 3 and 4, the stabilizing fixture 100 further includes a sliding structure 50. The sliding structure 50 includes a slider 51 and a rail 53. The slider 51 is fixedly coupled with the base 10, and the rail 53 is formed on the pressing component 20 20, but is not so limited. The slider 51 may be fixedly coupled with the pressing component 20, and the rail 53 can be formed on the base 10.

The slider 51 extends from the plate 11 in the first direction X. The slider 51 is located on one side of the first through hole 111. The pressing component 20 further includes a connecting part 29. The connecting part 29 extends from the first pressing part 23 in a first direction X. The rail 53 is formed on the connecting part 29 between two bulges 22. The two bulges 22 are spaced apart in the second direction Y on the connecting part 29. The slide member is slidably coupled with the rail 53 for guiding the pressing component 20 to slide in the first direction X relative to the base 10.

The slider 51 is integrally formed on the base 10, but is not so limited. For example, the slider 51 may also be welded to the base 10.

The projection of the two bulges 22 partially overlaps with the projection of the plate 11 along a first direction X. The two bulges 22 limit the pressing component 20 from the base 10 when the pressing component 20 moves in the first direction X.

The stabilizing fixture 100 further includes a mounting member 37. The mounting member 37 is fixedly coupled with the base 10. The mounting member 37 acts on the nut 33 away from the pressing component 20. The mounting member 37 is configured to limit the rotation of the nut 33 relative to the base 10. When the pressing component 20 receives force or impact from the server 300, the mounting member 37 prevents the nut 33 from moving away from the server 300. The mountings can share the force or impact from the server 300, thus preventing deformation of the threaded rod 313.

As shown in FIGS. 1 and 2, the base 10 further includes a second pressing part 15. The second pressing part 15 is located on the side of the plate 11 away from the clamping pair 13. A second pressing surface 151 is defined on the second pressing part 15. The second pressing surface 151 is perpendicular to the first pressing surface 231. The first pressing surface 231 is perpendicular to the first direction X. The second pressing surface 151 is perpendicular to the third direction Z. The first pressing surface 231 and the second pressing surface 151 press against two intersecting sides of the server 300.

The stabilizing fixture 100 further includes two bolts 24. Two first fastening holes are defined on the plate 11, two second fastening holes are defined on the second pressing part 15. Each of the two bolts 24 passes through a first fastening hole and a second fastening hole for connecting and fixing together the second pressing part 15 and the plate 11.

The cabinet 200 further includes a carrier member 203. The carrier member 203 is fixedly coupled with the column 201 for supporting the server 300 in the third direction Z. The server 300 is gripped between the carrier member 203 and the second pressing part 15 to limit the position of the server 300 along the third direction Z.

As shown in FIG. 2, a first shim 1011 is set on the first pressing surface 231. The first pressing surface 231 applies pressure to the server 300 through the first shim 1011. A second shim 1013 is set on the second pressing surface 151. The second pressing surface 151 applies pressure to the server 300 through the second shim 1013.

The stabilizing fixture 100 further includes a guiding plate 60. A guiding surface is defined on the guiding plate 60 for keeping the server 300 between the two stabilizing fixtures 100. The guiding surface is inclined to the first pressing surface 231. The guiding plate 60 is integrally formed on the base 10, but is not limited thereto. For example, the guiding plate 60 may also be welded to the base 10.

As shown in FIG. 3, the base 10 further includes a flange 17. The flange 17 improves the strength of the base 10. The flange 17 extends from the side of the plate 11 along the first direction X.

A second through hole 171 is defined on the flange 17 for exposing the adjusting part 311 in the second direction Y. When the base 10 is mounted on the column 201, the adjusting part 311 can also be exposed from the column 201. The screw 31 is rotated relative to the nut 33 by using a tool passing through the second through hole 171 and acting on the adjusting part 311, so that the nut 33 moves along the second direction Y.

The rotation of the screw 31 drives the nut 33 to slide, so that the second bevel 331 pushes the first bevel 21 to slide the pressing component 20 along the first direction X. As the pressing component 20 slides along the first direction X, the distance between the two pressing components 20 changes to accommodate servers 300 of different sizes.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including, the full extent established by the broad general meaning of the terms used in the claims.

What is claimed is:

1. A stabilizing fixture comprising:
a base;
a pressing component slidably coupled with the base in a first direction, the pressing component comprises a first bevel and a first pressing surface, the first pressing surface is configured to press a server; and
an adjusting component comprises:
a screw rotatably coupled with the base; and
a nut threaded to the screw, the nut comprises a second bevel, wherein:
when the screw is rotated relative to the nut, the nut is driven to move in a second direction, and
the second bevel acts on the first bevel to drive the pressing component to move in the first direction such that the pressing component presses the server when the nut moves in the second direction;
the stabilizing fixture further comprises a guiding structure, the guiding structure comprises:
a first guiding member coupled with the nut;
a second guiding member coupled with the pressing component,
when the first guiding member contacts a side of the second guiding member away from the nut, the first guiding member stops the pressing component from disengaging from the nut.

2. The stabilizing fixture of claim 1, wherein the first guiding member comprises:
a first part extending from the second bevel;
a second part extending from the first part in a direction parallel to the second bevel, wherein the second guiding member extends into a gap between the second part and the second bevel.

3. The stabilizing fixture of claim 1, wherein the pressing component further comprises:
a first pressing part;
a first guiding part coupled with the first pressing part;
a surface of the first guiding part away from the first pressing part forms at least a portion of the first bevel.

4. The stabilizing fixture of claim 3, wherein the pressing component further comprises:
a second guiding part, coupled with the first pressing part and spaced from the first guiding part;
a surface of the first guiding part away from the first pressing part and a surface of the second guiding part away from the first pressing part together form the first bevel.

5. The stabilizing fixture of claim 3 further comprising sliding structure, wherein:
the sliding structure comprises a slider and a rail;
one of the slider and the rail is coupled with the base, and the other one of the slider and the rail is coupled with the pressing component;
the slider is slidably coupled with the rail, the slider guides the pressing component to move with the base.

6. The stabilizing fixture of claim 5, wherein:
the pressing component further comprises a connecting part;
the connecting part is coupled with the first pressing part;
the slider is coupled with the base, and the rail is coupled with the connecting part.

7. The stabilizing fixture of claim 6, wherein:
the pressing component further comprises two bulges;
the two bulges are coupled with the connecting part;
the two bulges are spaced apart in the second direction;
the rail is formed on the connecting part, the rail is between the two bulges.

8. The stabilizing fixture of claim 1, wherein:
the adjusting component further comprises a mounting member;
the mounting member is coupled with the base, the mounting member drives on the nut away from the pressing component such that the nut cannot rotate relative to the base.

9. The stabilizing fixture of claim 1, wherein:
the base comprises:
a plate defining a first through hole, the pressing component is slidably received in the first through hole;
a clamping pair comprises two clamping portions each coupled with the plate and spaced apart from each other, the two clamping portions being on respective opposite sides of the first through hole,
a mounting hole is defined on each of the two clamping portions, the screw extends through the mounting hole, and is rotatably coupled with the two clamping portions.

10. The stabilizing fixture of claim 9, wherein:
the base further comprises a second pressing part;
the second pressing part is coupled with the plate, and is located on a side of the plate away from the clamping pair;
a second pressing surface is defined on the second pressing part, the second pressing surface is perpendicular to the first pressing surface.

11. The stabilizing fixture of claim 9 further comprising a guiding plate, wherein:
the guiding plate is coupled with the plate;

a guiding surface is defined on the guiding plate, the guiding surface guides the server towards the first pressing surface.

12. The stabilizing fixture of claim 10 further comprising two bolts, wherein:
the second pressing part is fixedly connected to the plate by the two bolts.

13. The stabilizing fixture of claim 1 further comprising a first shim, wherein:
the first shim is located on the first pressing surface.

14. The stabilizing fixture of claim 10 further comprising a second shim, wherein:
the second shim is located on the second pressing surface.

15. The stabilizing fixture of claim 9 wherein:
an adjusting part is defined at one end of the screw and a threaded rod is defined at the other end of the screw;
the adjusting component comprises a fastener threaded with the threaded rod;
the fastener and the adjusting part are located on respective, opposite sides of the clamping pair in the second direction.

16. The stabilizing fixture of claim 15, wherein:
the base further comprises a flange;
the flange extends from a side of the plate in the first direction.

17. The stabilizing fixture of claim 16, wherein:
a second through hole is defined on the flange, the second through hole exposes the adjusting part in the second direction.

\* \* \* \* \*